(12) United States Patent
Patel

(10) Patent No.: US 7,184,267 B2
(45) Date of Patent: Feb. 27, 2007

(54) LONGITUDINALLY COOLED ELECTRONIC ASSEMBLY

(75) Inventor: Chandrakant D Patel, Fremont, CA (US)

(73) Assignee: Hewlett-Packard Development Company, LP., Houston, TX (US)

(*) Notice: Subject to any disclaimer, the term of this patent is extended or adjusted under 35 U.S.C. 154(b) by 306 days.

(21) Appl. No.: 10/735,467

(22) Filed: Dec. 12, 2003

(65) Prior Publication Data

US 2005/0128704 A1   Jun. 16, 2005

(51) Int. Cl.
H05K 7/20   (2006.01)

(52) U.S. Cl. ............... 361/692; 361/695; 361/727; 454/184

(58) Field of Classification Search ............. 361/687, 361/692–696, 698, 714, 723, 724, 727; 312/265.3, 312/223.2, 236, 223.3; 174/16.1, 16.3, 15.1, 174/252; 165/80.3, 104.33, 122, 124, 126; 454/184

See application file for complete search history.

(56) References Cited

U.S. PATENT DOCUMENTS

| | | | |
|---|---|---|---|
| 4,158,875 A * | 6/1979 | Tajima et al. ............ | 361/695 |
| 4,489,363 A * | 12/1984 | Goldberg ............... | 361/693 |
| 4,756,473 A | 7/1988 | Takemae et al. | |
| 4,817,865 A | 4/1989 | Wray | |
| 5,019,880 A | 5/1991 | Higgins, III. | |
| 5,216,579 A | 6/1993 | Basara et al. | |
| 5,219,579 A * | 6/1993 | Tisdale et al. ........... | 424/573 |
| 5,361,188 A | 11/1994 | Kondou et al. | |
| 5,409,352 A | 4/1995 | Lin | |
| 5,414,591 A * | 5/1995 | Kimura et al. ........... | 361/695 |
| 5,505,533 A | 4/1996 | Kammersqard et al. | |
| 5,559,673 A | 9/1996 | Gagnon et al. | |
| 5,640,046 A | 6/1997 | Suzuki et al. | |
| 5,661,638 A | 8/1997 | Mira | |
| 6,052,282 A * | 4/2000 | Sugiyama et al. ........ | 361/690 |
| 6,105,875 A * | 8/2000 | LaGrotta et al. ......... | 236/44 A |

(Continued)

FOREIGN PATENT DOCUMENTS

DE   004035213 A1 *   5/1992

(Continued)

OTHER PUBLICATIONS

The Article: "Open-Loop Cooling System for Computers in an Environmemnt"☐☐☐☐IBM Technical Disclosure Bulletine, Nov. 1989,☐☐☐☐Volume No. 32; Issue No. 6B; pp. 417-419.*

(Continued)

*Primary Examiner*—Michael Datskovskiy
(74) *Attorney, Agent, or Firm*—Richard P. Lange

(57) ABSTRACT

An enclosure forms a plurality of tiers vertically stacked in a longitudinal dimension, each tier supporting two lateral stacks of printed circuit board cards. Each tier has an associated distribution plenum contiguous to a top longitudinal end of the tier and an associated exhaust plenum contiguous to a bottom longitudinal end of the tier. A pump receives air from a pump plenum, and pressurizes the distribution plenum with that air. The distribution plenum distributes the pressurized air through jets in the top of the tier, creating directed streams of cooling air. In the tier, the air flows longitudinally to the exhaust plenum on the bottom of the tier. The air laterally enters the enclosure via the pump plenum, and laterally exits the enclosure via the exhaust plenum.

28 Claims, 3 Drawing Sheets

U.S. PATENT DOCUMENTS

| | | | |
|---|---|---|---|
| 6,134,108 A | 10/2000 | Patel et al. | |
| 6,222,729 B1 * | 4/2001 | Yoshikawa | 361/695 |
| 6,305,556 B1 | 10/2001 | Mayer | |
| 6,415,619 B1 | 7/2002 | Bash et al. | |
| 6,424,534 B1 | 7/2002 | Mayer et al. | |
| 6,490,877 B2 | 12/2002 | Bash et al. | |
| 6,496,366 B1 | 12/2002 | Coglitore et al. | |
| 6,525,936 B2 | 2/2003 | Beitelmal et al. | |
| 6,535,382 B2 * | 3/2003 | Bishop et al. | 361/690 |
| 6,574,104 B2 | 6/2003 | Patel et al. | |
| 6,574,970 B2 * | 6/2003 | Spinazzola et al. | 62/89 |
| 6,611,428 B1 * | 8/2003 | Wong | 361/695 |
| 6,616,251 B2 | 9/2003 | Searby | |
| 6,626,300 B2 | 9/2003 | Kaminski et al. | |
| 6,628,520 B2 | 9/2003 | Patel et al. | |
| 6,644,058 B2 | 11/2003 | Bash et al. | |
| 6,652,374 B2 * | 11/2003 | Sharp et al. | 454/184 |
| 6,662,865 B2 | 12/2003 | Beitelmal et al. | |
| 6,672,381 B2 | 1/2004 | Beitelmal et al. | |
| 6,678,156 B2 * | 1/2004 | Moizer | 361/690 |
| 6,694,759 B1 | 2/2004 | Bash et al. | |
| 6,775,137 B2 * | 8/2004 | Chu et al. | 361/696 |
| 6,819,563 B1 * | 11/2004 | Chu et al. | 361/696 |
| 6,882,531 B2 * | 4/2005 | Modica | 361/687 |
| 6,912,129 B2 * | 6/2005 | Baker et al. | 361/695 |
| 2003/0198018 A1 | 10/2003 | Cipolla et al. | |
| 2006/0019597 A1 | 1/2006 | Beitelmal et al. | |

FOREIGN PATENT DOCUMENTS

| | | | |
|---|---|---|---|
| DE | 4035213 | * | 11/1992 |
| JP | 405235570 A | * | 9/1993 |

OTHER PUBLICATIONS

Patel, Chandrakant D., "A Vision of Energy Aware Computing from Chips to Data Centers," ISMME2003-K15, The International Symposium on Micro-Mechanical Engineering, Dec. 1-3, 2003.

Beitelmal, Saad and Patel, "Effects of Surface Roughness on the Average Heat Transfer of an Impinging Air Jet" (Int. Comm. Heat Mass Transfer, vol. 27, No. 1, pp. 1-12, 2000).

Beitelmal, Saad and Patel, "The effect of inclination on the heat transfer between a flat surface and an impinging two-dimensional air jet" (Int'l J. Heat and Fluid Flow 21 (2000) 156-163).

* cited by examiner

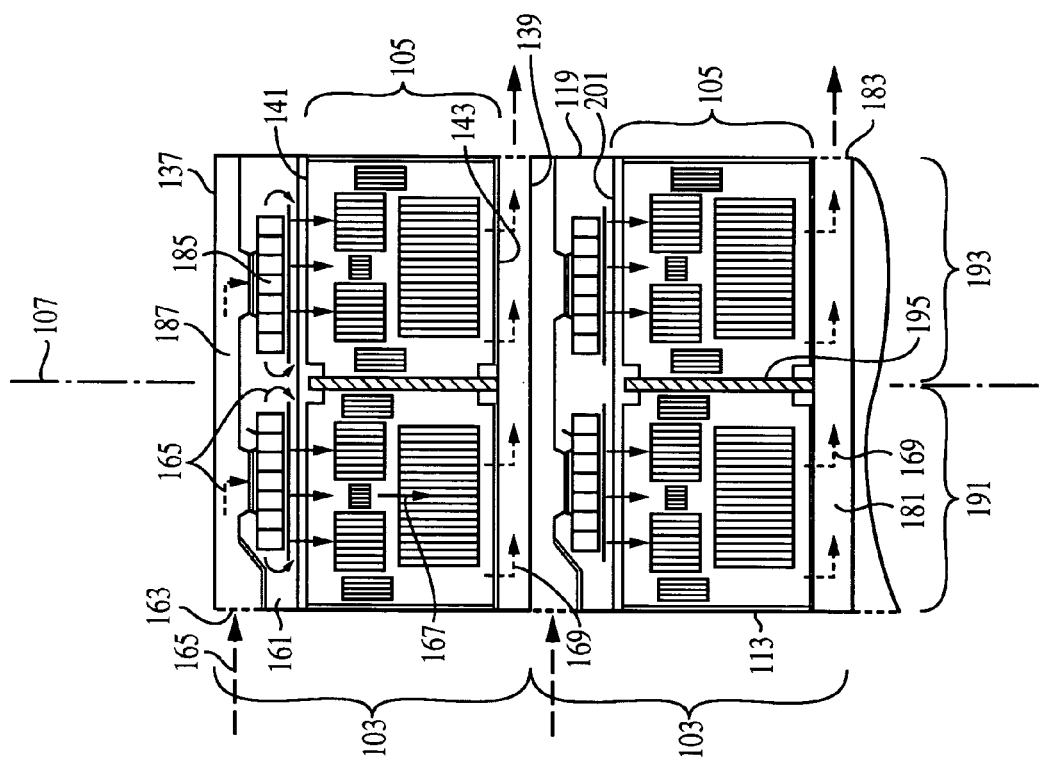
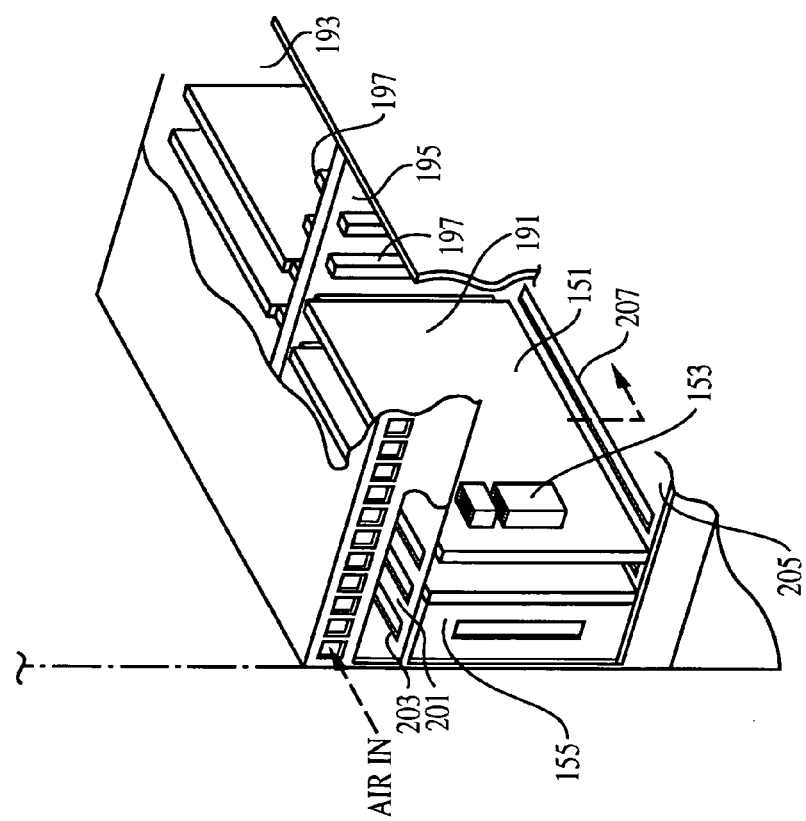
FIG. 3
FIG. 2

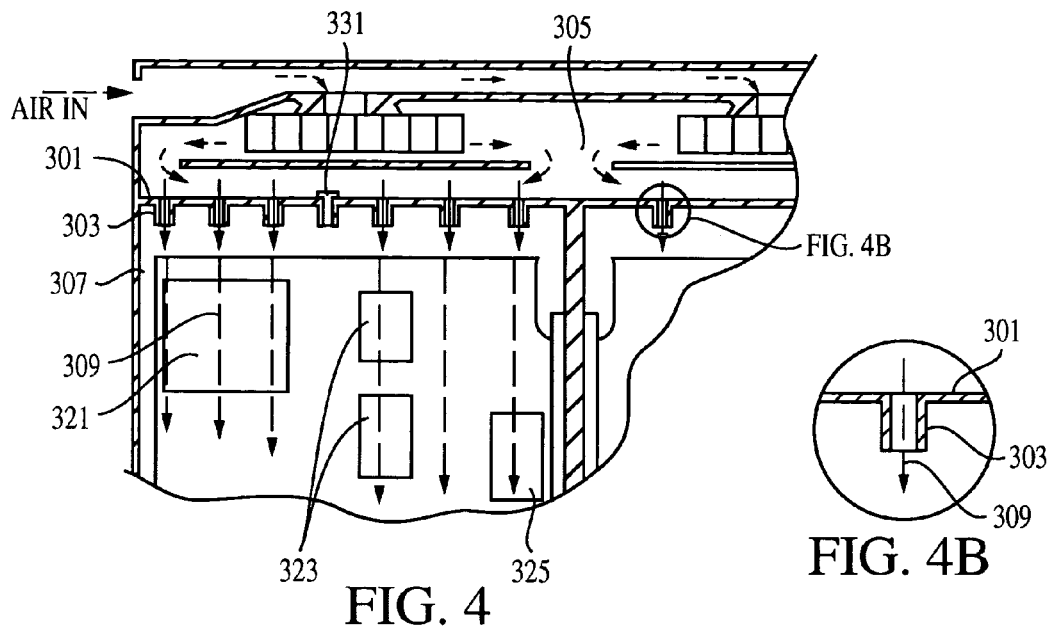
FIG. 4
FIG. 4B
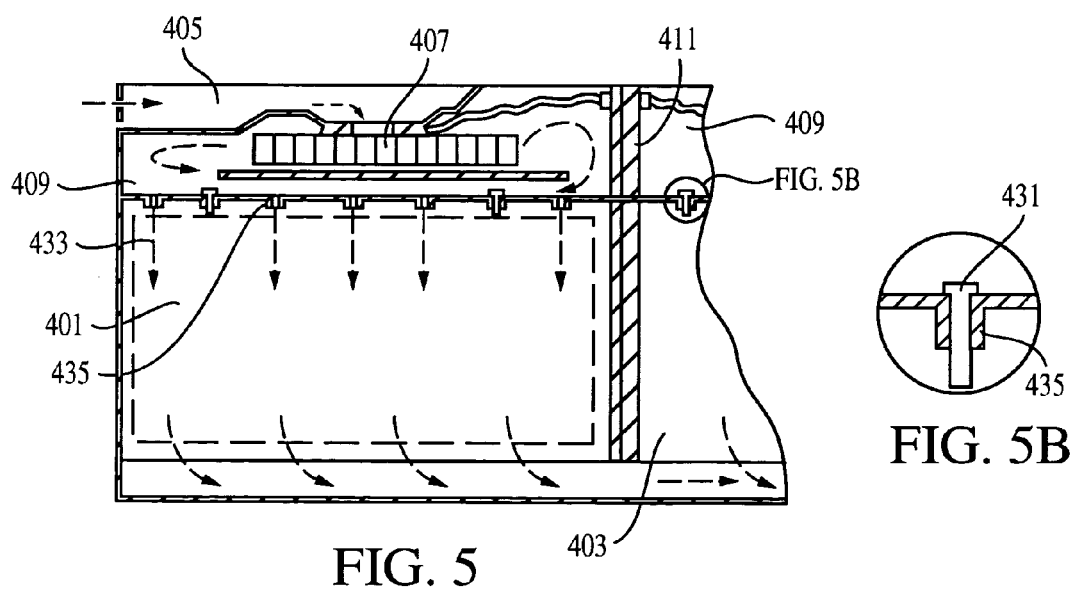
FIG. 5
FIG. 5B

LONGITUDINALLY COOLED ELECTRONIC ASSEMBLY

The present invention relates generally to modular enclosures for components and, more particularly, to cooling systems for cooling components on cards that are mounted in system racks.

BACKGROUND OF THE INVENTION

Rack-based enclosures are commonly used for supporting groups of electronic assemblies such as cards, i.e., components mounted on printed circuit boards, forming computer systems or groups of computer components. The racks typically provide an environment that enables heat removal and protection from excessive heat, shock, vibration and/or dust. The electronic assemblies are used to form electronic applications, such as server farms that serve the networking needs of large organizations.

In response to demands for high performance systems, components are being designed with increased cooling requirements, printed circuit boards are being designed with increased component densities, and/or cards are being mounted closer together (i.e., positioned in more-closely spaced parallel planes) within computer chasses. While these factors all tend to increase cooling capacity requirements, a number of factors are decreasing typical cooling capabilities. For example, an increasingly close card proximity tends to increase airflow impedance, and decrease the allowable maximum component height on each card. Furthermore, high-power, high-speed circuits sometimes require very small or indirect ventilation openings so as to contain electromagnetic radiation. These problems tend to create cooling issues such as hot spots, dead zones and/or insufficient cooling capacity.

Present day rack-based enclosures commonly comprise a framework that carries and supports cards in a plurality of vertically stacked tiers. Typical industry standards for such enclosures allow for structures having a height of 40U or 42U, where U is 1.75 inches, and a useful internal width of approximately 17.7 inches with an external width of approximately 24 inches. Some typical configurations for such structures include a number of relatively slim tiers (e.g., about 1U in height), and others include a smaller number of taller tiers (e.g., 6 or 7 U in height) that hold a plurality of blades (i.e., printed circuit board cards oriented with their plane normal to a horizontal axis). In this latter configuration, the blades are typically stacked laterally across the width of the tier (i.e., the cards share the same approximate footprint in parallel planes that are normal to a width direction of the enclosure).

Each such card might be edge-mounted to a card connector on a bottom wall or back-plane (back wall) of the tier. In either case, the tier will typically include standard-configuration cards that mount such that their depth dimension (with respect to the tier) is greater than their height dimension, thus minimizing the height of each tier. In some cases, a single tier can include two such lateral stacks, one in a front half of the tier and one in a back half of the tier, with a ventilated mid-plane (i.e., having ventilation holes) dividing the front and back halves and serving as the rearward wall for card insertion, and carrying card connectors for both halves.

To maintain component temperatures inside rack-based enclosures, each tier of the enclosure typically includes ventilation holes in front and rear panels of the tier. A cooling fan is configured to draw ambient air through the enclosure, with the air traveling laterally across a depth direction (i.e., in either a front-to-back, or a back-to-front direction), the ventilation holes providing an entrance and an exit. Optionally, chilled air could be directed from an air cooling unit into the ventilation holes used for air intake.

Within each tier, the air flows unidirectionally through the depth dimension of the tier, tangential to the cards, typically at speeds of 1 m/s to 2 m/s, and possibly at speeds approaching 4 m/s. This tends to cause multiple components, and possibly numerous components, to be cooled in series. Consequently, the downstream components are cooled by preheated air, and thus are cooled by lesser amounts than are the upstream components. Furthermore, for tiers having front and back lateral stacks of cards, one lateral stack will be cooled by air that was preheated by the other stack.

An exemplary system might move air from front to back across two lateral stacks of cards. These cards might include single card processor units and I/O cards, each being mounted to a perforated backplane. The system air movers (e.g., fans) provide mass flow for a given temperature rise, e.g., 15 degrees centigrade, across the system based on maximum power dissipation from all the cards. An objective might be to maintain the microprocessor heat sinks such that the CPU cores are at a specified temperature of 85 to 90 degrees centigrade. For a system having 10 cards having a power dissipation of 250 W each (for a total of 2.5 kW), it is believed that a flow rate of 0.150 $m^3$/s (312 CFM) at about 200 Pa (0.8 in of water) of pressure drop is required. This pressure drop is very high, and is hard to maintain with the axial fans that are typically used in this context.

It will be appreciated that there is a need for a system and an apparatus for effectively cooling the heat dissipating components of a rack-based electronic system having a high density of heat-generating components. There is also a need for a system and apparatus having good characteristics in protecting components from shock, vibration and/or dust, and particularly one with a minimum of size and cost. Preferred embodiments of the present invention satisfy some or all of these needs, and provide further related advantages.

SUMMARY OF THE INVENTION

In various embodiments, the present invention solves some or all of the needs mentioned above, providing an enclosure configured to cool components. More particularly, the enclosure is configured to form a plurality of tiers stacked in a longitudinal dimension. Each tier has opposite first and second longitudinal ends with respect to the longitudinal dimension, each first longitudinal end optionally (but not necessarily) being oriented in the same direction with respect to the enclosure. Within each tier, the tier supports assemblies, such as printed circuit board cards.

The enclosure defines one or more distribution plena, one typically being contiguous to the first longitudinal end of each tier. Each distribution plenum is configured to distribute received coolant (e.g., air) longitudinally through the first longitudinal end of its tier. In various embodiments, the enclosure further defines one or more exhaust plena, each typically being contiguous to the second longitudinal end of its respective tier, the exhaust plenum being configured to channel away coolant received from the second longitudinal end of the first tier. These embodiments will typically be characterized by providing a substantially longitudinal flow of coolant through the tier, which will typically limit the reusing of coolant over a large number of components (as might more frequently occur with lateral flow over multiple cards).

In various embodiments, a plurality of pumps is configured to pump coolant such that they raise the pressure within the distribution plenum (or plena) of each tier, such that the coolant passes sequentially through the distribution plenum, the tier, and the exhaust plenum. The pump receives coolant from a pump plenum configured to feed the plurality of pumps for a respective tier. The pump plenum typically allows coolant for the entire tier to be drawn laterally from one side of the enclosure, which is typically opposite from a side of lateral exhaust. The pump plena preferably provide for the use of higher powered pumps distributed over the tier.

Other features and advantages of the invention will become apparent from the following detailed description of the preferred embodiments, taken with the accompanying drawings, which illustrate, by way of example, the principles of the invention. The detailed description of particular preferred embodiments, as set out below to enable one to build and use an embodiment of the invention, are not intended to limit the enumerated claims, but rather, they are intended to serve as particular examples of the claimed invention.

BRIEF DESCRIPTION OF THE DRAWINGS

FIG. 2 is a partial, perspective, cutaway view of one level of the enclosure of FIG. 1.

FIG. 3 is a partial cross sectional view of two levels of the enclosure of FIG. 1, taken along line 3—3 of FIG. 1.

FIG. 4 is a partial cross sectional view of a first alternative embodiment of the enclosure of FIG. 1, the first alternative embodiment containing printed circuit board cards.

FIG. 5 is a partial cross sectional view of a second alternative embodiment of the enclosure of FIG. 1, the second alternative embodiment containing printed circuit board cards.

DETAILED DESCRIPTION OF THE PREFERRED EMBODIMENTS

The invention summarized above and defined by the enumerated claims may be better understood by referring to the following detailed description, which should be read with the accompanying drawings. This detailed description of particular preferred embodiments of the invention, set out below to enable one to build and use particular implementations of the invention, is not intended to limit the enumerated claims, but rather, it is intended to provide particular examples of them.

Typical embodiments of the present invention reside in a tiered apparatus for supporting, cooling, and connecting or interconnecting a plurality of electronic assemblies. The tiered apparatus, typically in the form of a housing, rack, and/or some other type of enclosure, can optionally be configured with wiring such that the electronic assemblies interconnect to form computer systems or other electronic devices.

Figure 1:
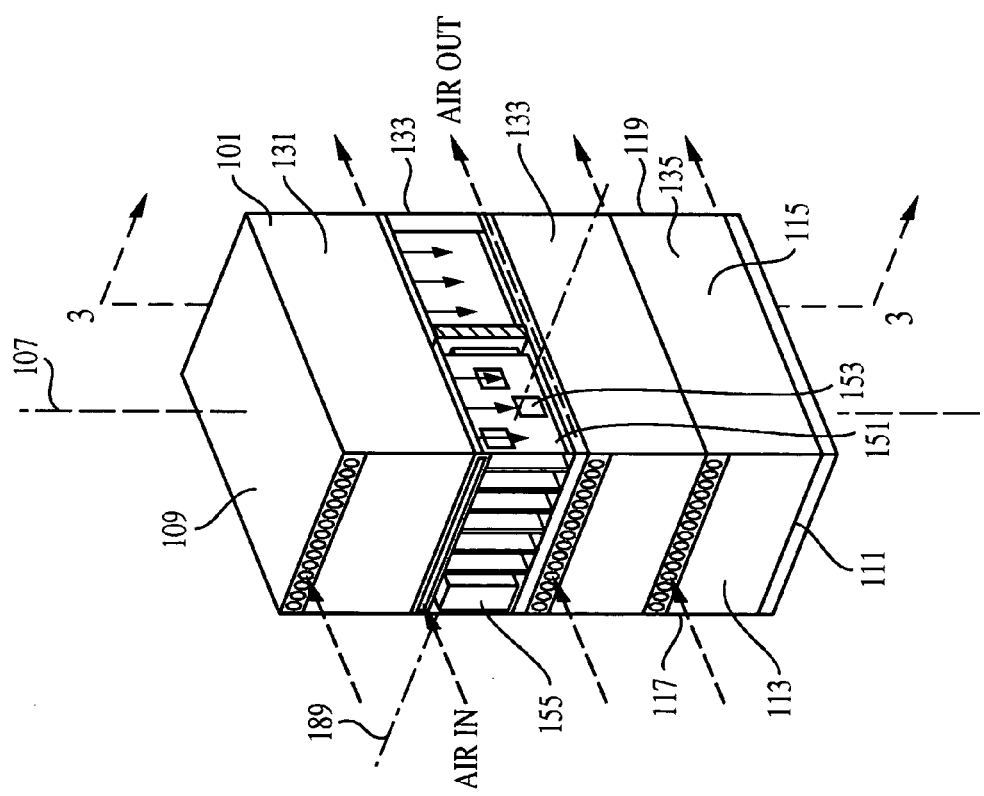
FIG. 1 is a perspective view of an enclosure embodying the invention, the enclosure containing printed circuit board cards and a power supply, and the enclosure having two side walls of one level removed for illustrative purposes.

With reference to FIGS. 1–3, a first embodiment of the present invention is an apparatus forming a tiered structure. More particularly, the embodiment includes an enclosure 101 that is configured to form a plurality of levels 103. Each level contains a tier 105, and the levels are stacked in a tier-stacking dimension, which shall be referred to as a longitudinal dimension 107. The longitudinal dimension will extend between two ends of the stack, a first end 109 (e.g., a top end) and a second end 111 (e.g., a bottom end). In addition to the first and second ends, the tiered structure includes a front side 113, a right side 115, a left side 117 and a rear side 119. While the terms top and bottom are used for ends on either longitudinal end of the stack of levels, it should be understood that the use of these terms references the longitudinal tier-stacking dimension, and does not imply that the longitudinal dimension necessarily extends in a gravitationally vertical dimension.

The levels (and tiers) are serially arranged, and typically include a top tier 131 at the top end 109 of the enclosure 101, one or more (optional) intermediate tiers 133, and a bottom tier 135 at the bottom end of the enclosure. Each level 103 has opposite ends, a top end 137 and a bottom end 139, along (and with respect to) the tier-stacking dimension, each typically being 7U to 10U in height. Likewise, each tier 105 has opposite ends, a top end 141 and a bottom end 143, along (and with respect to) the tier-stacking dimension. The top and bottom levels are each attached to one other level on their bottom and top longitudinal ends, respectively, while the intermediate levels are each attached to two levels, one on each of their two longitudinal ends. If there are no intermediate levels, the top and bottom levels are attached to each other. Each level, and each tier, also has a front side, a rear side, a right side and a left side, each level side and each tier side corresponding to the similarly named sides of the enclosure.

Each tier 105 is configured with supports to support one or more electronic assemblies of the plurality of electronic assemblies. The electronic assemblies of a typical embodiment are primarily cards 151, each carrying one or more semiconductor components 153. The electronic assemblies could also include related devices, such as power supplies 155. Each tier can optionally be configured as a chassis for one or more electronic devices (e.g., a computer chassis). Alternatively, the electronic assemblies could be other types of cards, or other types of electronic assemblies. Indeed, it is within the scope of the invention to cool other types of assemblies that require cooling, such as optical devices and the like.

For each given level 103, the enclosure 101 also has surfaces that define a distribution plenum 161 contiguous to the first (i.e., top) end of the respective tier 105. The distribution plenum is configured such that a coolant is received laterally into the enclosure through an inlet vent 163 on the front side of the enclosure, and supplied to the distribution plenum.

Additionally, for each given level 103, the enclosure 101 also has surfaces defining an exhaust plenum 181 contiguous to the bottom end of the respective tier 105. The exhaust plenum is configured to longitudinally receive the warmed coolant from the second (i.e., bottom) longitudinal end of the tier, and to channel the received coolant laterally out of the enclosure through an exhaust vent 183 on the rear surface of the enclosure, preferably without directly exposing any further cards 151 to the warmed coolant. Alternate embodiments could place the vents on other sides of the enclosure, or could have the vents lead to an external plenum for more distant venting. The exhaust vent is typically at a side location on the level, the side location being longitudinally aligned with the exhaust plenum. The exhaust is vented on the opposite (rear) side of the enclosure from the inlet so as to minimize or eliminate having warm coolant drawn into the inlet vent 163.

The coolant is typically ambient air, but could also be chilled air or another gaseous fluid (or conceivably even a liquid fluid for an appropriate application). The coolant follows a distribution flow path 165 such that the distribution plenum 161 distributes the received coolant longitudinally through the first longitudinal end of the given tier 105 and into the tier. The coolant further moves along an unidirectional cooling flow path 167 in the given tier, in a generally longitudinal direction, cooling components 153 on the cards 151, and becoming warmer while doing so. Finally, the coolant moves along an exhaust flow path 169 in the given level 103, exiting the tier in a generally longitudinal direction, and then laterally flowing through the exhaust plenum 181.

Each given level 103 is preferably configured with one or more fluid air movers (e.g., pump 185) to pump coolant such that it passes sequentially through the distribution plenum 161, the tier 105, and the exhaust plenum 181 (i.e., such that the coolant passes substantially longitudinally through the tier). The pump is preferably configured to raise the pressure within the distribution plenum, and thereby create pressure differentials between the distribution plenum, the tier, and the exhaust plenum to drive the flow.

To provide the pump 185 with coolant from the inlet vent 163, the enclosure 101 further includes a pump plenum 187 configured to place the pump in fluid communication with its respective vent. More particularly, for a pump that pressurizes the distribution plenum 161, the pump plenum places the pump in fluid communication with the inlet vent. Thus, the inlet vent is typically at a side location on the level, the side location being longitudinally aligned with the pump plenum and adjacent the distribution plenum 161.

Each vent and pump plenum 187 typically allows for the use of multiple pumps 185 that are powerful enough to provide significant coolant flow while requiring a minimum of longitudinal space. While such pumps might be typical cooling fans, they are more preferably backward curved impellers arranged with their axis of rotation along the longitudinal axis. By providing pumps with adequate pumping ability, the coolant can overcome significant flow impedance, cooling what would otherwise be hot spots and/or dead zones in configurations with high packing density.

The cards 151 are preferably a plurality of planar printed circuit board cards stacked laterally, with respect to the tier-stacking dimension, across each given tier 105, in a lateral card-stacking dimension 189. In this context, it should be understood that the term laterally could refer to any direction normal to the longitudinal dimension 107. In typical embodiments, the lateral, card-stacking dimension will be parallel to the front side of the tier, as depicted, i.e., across the width of the structure.

While each card 151 might be of a different size or shape, each tier 105 is preferably designed with typical interior spacing, and with typical card edge-mounted connection devices, such that each card in the lateral stack of cards will fall within the same general footprint in parallel planes that form the lateral stack. Other devices such as the power supply 155 are preferably configured likewise. Preferably the footprint will allow for a maximum card lateral dimension 189 (e.g., a depth dimension), with respect to the tier, that is greater than the maximum card height (longitudinal) dimension, thus minimizing the necessary longitudinal height of each tier. The connection devices can optionally be mounted on upper, lower, or rearward walls of the tier. Preferably, the connection devices are mounted on a rearward wall (with respect to a lateral card-insertion direction), allowing for cards to be both laterally inserted and connected in the card-insertion direction.

Optionally (and as depicted), each tier 105 can include two (or more) lateral stacks of cards 151, such as one in a front compartment 191 of the tier and one in a back compartment 193 of the tier. One (or more) mid-plane (walls) 195 will typically extend between the compartments. In the case of two compartments, the mid-plane might be configured as the wall mounting the card connectors 197 in both compartments, as well as supporting wiring for the card connections, including the wiring for a connection to the power supply 155 for the cards. Each compartment can have one or more pumps 185, and the mid-plane can be vented through the distribution plenum 161 to balance the operation of the pumps.

In the case of tiers that have multiple compartments, each pump plenum 187 preferably spans all of, or at least a substantial portion of, its respective tier 105 (e.g., extending through openings in the respective portion of the mid plane), thus allowing for the respective vent to be in fluid communication with pumps 185 located proximate each compartment. Likewise, the distribution plenum 161 and exhaust plenum 181 preferably span a substantial portion of the tier (e.g., likewise extending through openings in the respective mid plane).

Optionally, the surfaces defining each distribution plenum 161 can include a distribution-port-wall 201 defining apertures configured to direct the coolant into appropriate locations in the respective tier 105. The apertures are configured as longitudinal slots 203, each slot being configured to direct coolant over the surface of a given card 151, or into cooling apertures of the power supply 155.

Likewise, the surfaces defining each exhaust plenum 181 can include an exhaust-port-wall 205 defining apertures configured to receive the coolant from the respective tier 105. The exhaust-port-wall apertures are also configured as longitudinal slots 207. Typically, the exhaust-port-wall apertures will be configured to minimize the pressure drop from the tier into the exhaust plenum, while possibly allowing for wall structure (such as a track) that can provide structural support for the cards 151, and that can guide the cards into the connectors upon lateral insertion.

Depending on the coolant flow pressure differential between the distribution and exhaust plena, and on the airflow impedance of the tier, it can be expected that the coolant flow path might have a lateral drift toward the exhaust vent 183 (i.e., movement in a non-longitudinal direction). This will be somewhat limited by the mid-plane 195, which is preferably solid (i.e., not vented) within the tier 105, and thus along substantially the full height of the cards.

To improve cooling performance, the apertures in the distribution-port-wall 201 are preferably configured as jets. More particularly, the term "jet" is used in this context to indicate that the apertures are restricted enough in size to cause a significant pressure differential across the distribution-port-wall. In the present embodiment, the jets can be formed by configuring the slots 207 with their narrow dimension small enough to restrict the coolant flow. The resulting streams emitted by the jets will likely be fast-moving sheets of coolant emerging into the tier and across the surface of the cards.

From the significant pressure differential, the resulting coolant velocity will be increased by an amount significant to the cooling process, i.e., the resulting heat dissipation rate (cooling capability) will be different from that of a non-jet, small pressure differential case, by an amount of consequence from the standpoint of chip cooling requirements. Preferably, the coolant velocity from the jets is at least 4 m/s, and more preferably at least 6 m/s. Preferably the coolant velocity is no more than (and preferably is less than) 8 m/s. Because the coolant streams are more controlled than the less-directed coolant flow emitted in a non-jet embodiment, the streams will likely be less subject to lateral drift before entering the exhaust plenum.

The pressure differential across the distribution-port-wall 201 causes the coolant to emerge from the apertures with both an increased velocity and reduced mass flow, as compared to having large apertures or no distribution-port-wall. While the reduced, mass flow rate distributes less coolant (which is detrimental to heat dissipation), the increased velocity decreases the convective film boundary on the cooled components (which is advantageous to heat dissipation). For a given system, experimentation (e.g., varying pressure differential and aperture size) can be used to find optimum combinations of coolant mass flow and coolant velocity. It is believed that velocities between 4 m/s and 8 m/s are preferable, and between 6 m/s and 8 m/s are more preferable. Nevertheless, experimentation might show different results for different coolants, card configurations, tier configurations, pump configurations, and such.

With reference to a first alternative embodiment, depicted in FIG. 4, which is similar in form to the first embodiment, the apertures defined in the distribution-port-wall 301 are instead adapted to be a plurality of point jets 303 configured to maintain a significant pressure differential between each distribution plenum 305 and its respective tier 307, and to thereby direct substantially round streams 309 of pressurized coolant driven by the pressure differential between the distribution plenum and the tier. Preferably the streams of coolant are directed with tangential flow across the surface of one card (or two closely stacked cards), targeted toward components on the card that are in need of cooling. Because the streams are more controlled than the less-directed airflow emitted from the prior embodiment's slots, the streams will likely be less subject to lateral drift before entering the exhaust plenum.

Some components 321 can be cooled by multiple jets 303, and some components 323 might share the output of one or more jets. Some jets preferably provide directed cooling toward components 325 that are distant from the distribution plenum. The streams could be directed precisely parallel to the surface of the card (i.e., in either a longitudinal direction or angled toward or away from the mid-plane), or they could be angled toward or away from the surface of the card, possibly targeting the surfaces of particular components. Some components could be configured with heat sinks having a fin configuration for receiving laterally streamed air, thus improving heat dissipation from those components.

As represented in a second alternative embodiment, as depicted in FIG. 5, multiple compartments, such as a front compartment 401 and a back compartment 403, can be cooled by using a separate pump plenum 405 for each compartment, or even for each pump 407. Furthermore, the distribution plena 409 do not need to be shared between compartments, and can be separated by a non-vented midplane 411. While it is not depicted, it should be understood that each tier could optionally have a multitude of separate exhaust plena associated with the tier, such as for different compartments.

Also, as depicted with respect to both the first and second alternative embodiments, in FIGS. 4 and 5, plugs 331 or 431 can be used to block coolant-flow 309 or 433 through one or more apertures (e.g., being inserted in the jets 303 or 435), and thereby to custom configure the enclosure to support particular cooling location configurations.

Figure 6:
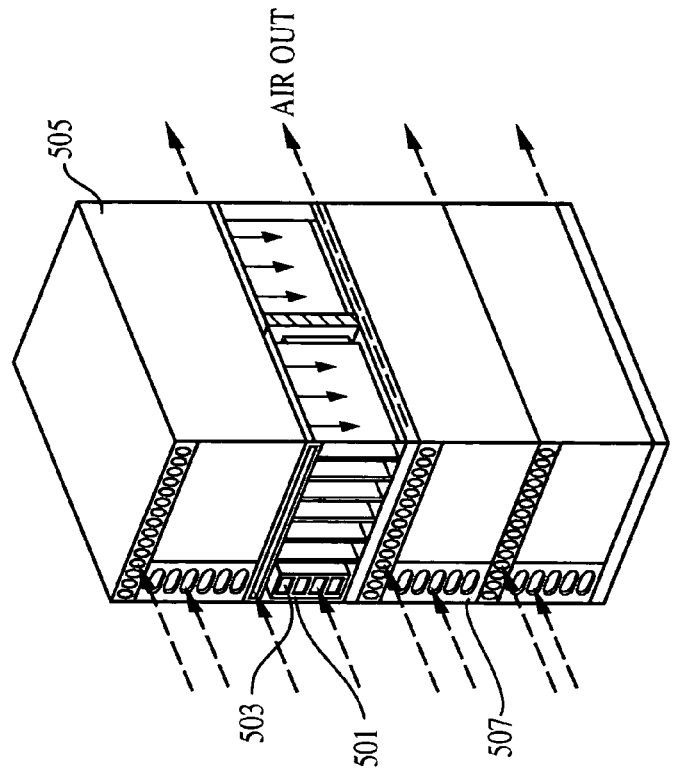
FIG. 6 is a perspective view of a third alternative embodiment of the enclosure of FIG. 1, the third alternative embodiment containing printed circuit board cards, and the third alternative embodiment having two side walls of one level removed for illustrative purposes.

As represented in a third alternative embodiment, depicted in FIG. 6, some electronic assemblies such as a power supply 501 might be configured with their own vents 503 and cooling systems. These systems could be partially or totally independent of the cooling system (i.e., the distribution and exhaust plena) provided by the enclosure 505. For such devices, the enclosure could include inlet and/or outlet panels 507 allowing the separate cooling systems to operate.

Each previously described embodiment consistently has a separate, distinct distribution plenum on the first longitudinal end (e.g., the top) of each tier, and channels the warmed coolant through a separate, distinct exhaust plenum on the second longitudinal end (e.g., the bottom) of each tier. Nevertheless, it is within the scope of the invention to have other configurations, such as an enclosure wherein proximate tiers have reversed plena orientations (i.e., the distribution plenum alternately on the top and then the bottom for proximate tiers), and possibly wherein proximate tiers share a common type of plena.

In other words, two adjoining tiers could each have their distribution plena located therebetween, and they could optionally share a common pump plenum (and inlet vent), a common distribution plenum, or both. Likewise, two adjoining tiers could each have their exhaust plena located therebetween, and they could optionally share a common exhaust plenum and exhaust vent. Additionally, in an alternative configuration having an exhaust plenum on both the top and bottom end of the enclosure, the top and bottom tiers could both directly vent through the top and bottom surfaces of the enclosure, respectively. This venting could replace the exhaust plena for those tiers.

In yet other alternative embodiments, longitudinal coolant flow can be provided by evacuating coolant from the exhaust plenum (i.e., lowering the coolant pressure in the exhaust plenum) with a pump, rather than pressurizing the distribution plenum. More particularly, under the pumping of the pump, the exhaust plenum is configured such that coolant is channeled and pumped, preferably into a pump plenum, to direct the coolant to and through the exhaust vent.

In this embodiment, the exhaust vent is typically at a side location on the level, the side location being longitudinally aligned with the pump plenum and longitudinally adjacent the exhaust plenum. The enclosure still preferably defines walls with orifices for directing coolant longitudinally into the tier from the distribution plenum, and the orifices are optionally in the form of jets. The distribution plena will typically connect directly and laterally to the inlet vent, and top or bottom tiers could replace the distribution plenum with inlet vents (which could be jets) on the top or bottom surfaces of the enclosure, respectively.

Other alternative embodiments could also replace the unpumped plena (e.g., the plenum that does not directly have its pressure adjusted by the pump) with lateral venting along the side of the tier. In such a case, either the coolant is directed longitudinally into the tier and lateral exhausted from the tier, or the coolant is sucked laterally into the tier and longitudinally exhausted from the tier. This arrangement typically provides for less-than-optimal efficiency with respect to the advantages that are associated with the longitudinal coolant flow. Nevertheless, the configuration might be adequate for some uses, and particularly when using jets to direct the incoming coolant, longitudinally over to the components that most require cooling.

Likewise, in other alternative embodiments, the plurality of pumps and the pump plena for all the levels could be replaced with a single pump plenum that extends longitudinally and connects all the otherwise pumped plena (i.e., all the plena that had their pressures directly adjusted by the pumps in comparable prior embodiments) to a larger pumping station, such as could be formed on a separate tier. The separate tier also could also optionally (or alternatively) house a power supply configured to power the various tiers. In an embodiment having a separate, preferably enclosure-wide power supply, each tier would likely have room to house additional cards.

While the depicted enclosures appeared as unitary bodies, it is to be understood that other configurations, such as modular structures that can be modularly disassembled, are within the scope of the invention. For example, each tier could be configured as a removable structure that inserts and removes from its level by laterally sliding between its respective plena. The distribution-port-walls could be configured to remove with the tier and open like a cover, or they could be unitary with the plenum. Alternatively, each level could be part of a removable module that includes its respective tier. Additionally, each level could be stackable, allowing for an enclosure of configurable longitudinal height (i.e., for a configurable number of tiers).

While providing good heat-removal characteristics, the enclosure is preferably configured with features known for typical enclosures, providing shock, vibration and/or dust protection. The external openings (e.g., the vents) are preferably well shielded from the components, allowing for good shielding of electromagnetic radiation.

It is to be understood that the invention comprises apparatus and related methods for designing and for producing cooling enclosures, as well as the apparatus and cooling methods of the enclosures themselves. Additionally, various embodiments of the invention can incorporate various combinations of the above described embodiments. In short, the above disclosed features can be combined in a wide variety of configurations within the anticipated scope of the invention.

Furthermore, embodiments of the invention can incorporate various combinations of the apparatus described in U.S. Pat. No. 6,134,108, issued Oct. 17, 2000, which is incorporated herein by reference for all purposes. For example, the air jet cooling system described in the patent could be incorporated into the above-described enclosure, being used for only particular components having extreme cooling needs. More particularly, a pumped distribution plenum could include extended jets that create streams directed normal to a card for cooling particular components.

While particular forms of the invention have been illustrated and described, it will be apparent that various modifications can be made without departing from the spirit and scope of the invention. Thus, although the invention has been described in detail with reference only to the preferred embodiments, those having ordinary skill in the art will appreciate that various modifications can be made without departing from the scope of the invention. Accordingly, the invention is not intended to be limited by the above discussion, and is defined with reference to the following claims.

I claim:

1. An apparatus for cooling a plurality of assemblies, comprising:
    an enclosure configured to form a plurality of tiers stacked along a longitudinal dimension, the plurality of tiers including a first tier;
    wherein each tier of the plurality of tiers has opposite first and second longitudinal ends with respect to the longitudinal dimension;
    wherein each tier is configured to support one or more assemblies of the plurality of assemblies;
    wherein the one or more assemblies that the first tier is configured to support comprise a plurality of planar cards stacked along a first lateral dimension, with respect to the longitudinal dimension, across the first tier;
    wherein the enclosure defines a distribution plenum longitudinally contiguous to the first longitudinal end of the first tier, the distribution plenum being configured to distribute received coolant through the first longitudinal end of the first tier;
    wherein the enclosure further defines an exhaust plenum longitudinally contiguous to the second longitudinal end of the first tier, the exhaust plenum being configured to channel away coolant received from the second longitudinal end of the first tier; and
    wherein the enclosure is configured such that coolant supplied to the distribution plenum is received into the enclosure in a direction along a second lateral dimension with respect to the longitudinal dimension, and such that coolant received by the exhaust plenum is channeled out of the enclosure in the direction along the second lateral dimension.

2. The apparatus of claim 1, wherein the enclosure further defines a separate distribution plenum for each tier, each distribution plenum being contiguous to the first longitudinal end of its respective tier, and being configured to distribute received coolant through the first longitudinal end of its respective tier.

3. The apparatus of claim 2, wherein the enclosure is configured such that coolant supplied to each distribution plenum is drawn laterally into the enclosure, with respect to the longitudinal dimension, at a level-side location longitudinally adjacent the distribution plenum.

4. The apparatus of claim 2, wherein the enclosure further defines a separate exhaust plenum for each tier, each exhaust plenum being contiguous to the second longitudinal end of its respective tier, and being configured to channel away coolant received from the second longitudinal end of its respective tier.

5. The apparatus of claim 4, wherein the enclosure is configured such that coolant received by the exhaust plenum is channeled laterally out of the enclosure, with respect to the longitudinal dimension, at a level-side location longitudinally aligned with the exhaust plenum.

6. The apparatus of claim 4, wherein the enclosure is configured such that coolant supplied to each distribution plenum is drawn laterally into the enclosure, with respect to the longitudinal dimension, at a level-side location longitudinally adjacent the distribution plenum, and such that coolant received by the exhaust plenum is channeled laterally out of the enclosure, with respect to the longitudinal dimension, at a level-side location longitudinally aligned with the exhaust plenum.

7. The apparatus of claim 1, wherein the first lateral dimension is normal to the second lateral dimension.

8. The apparatus of claim 1, wherein the one or more assemblies that the first tier is configured to support further comprise a second plurality of planar cards stacked along the first lateral dimension across the first tier, and further comprising a substantially non-vented mid-plane between the first and second plurality of planar cards, wherein the mid-plane is normal to the second lateral dimension.

9. The apparatus of claim 1, and further comprising a pump configured to pump coolant such that it passes sequentially through the distribution plenum, the tier, and the exhaust plenum, wherein:
the enclosure includes a pump plenum configured to laterally receive the coolant received into the enclosure;
the pump is configured to receive coolant from the pump plenum; and
the tier is configured to receive coolant from the pump.

10. The apparatus of claim 1, wherein the distribution plenum includes a wall defining a boundary between the distribution plenum and the first longitudinal end of the first tier, the wall including a plurality of orifices configured to direct coolant received by the distribution plenum through the first tier at selected locations.

11. The apparatus of claim 10, wherein the plurality of orifices are configured as downward pointing jets.

12. An apparatus for cooling a plurality of assemblies, comprising:
an enclosure configured to form a plurality of tiers stacked in a longitudinal dimension, the plurality of tiers including a first tier;
wherein each tier of the plurality of tiers has opposite first and second longitudinal ends with respect to the longitudinal dimension;
wherein each tier is configured to support one or more assemblies of the plurality of assemblies;
wherein the enclosure defines a distribution plenum longitudinally contiguous to the first longitudinal end of the first tier, the distribution plenum being configured to distribute received coolant through the first longitudinal end of the first tier;
wherein the distribution plenum includes a wall defining a boundary between the distribution plenum and the first longitudinal end of the first tier, the wall including a plurality of orifices configured to direct coolant received by the distribution plenum through the first tier at selected locations; and
wherein the plurality of orifices are configured as downward pointing jets.

13. The apparatus of claim 12, wherein the jets direct streams of coolant toward the plurality of assemblies.

14. The apparatus of claim 12, wherein the jets are configured as slots that emit streams forming sheets of coolant.

15. The apparatus of claim 12, wherein the jets emit coolant at a velocity of at least 4 m/s.

16. The apparatus of claim 12, wherein the jets emit coolant at a velocity of at least 6 m/s.

17. The apparatus of claim 12, wherein the jets emit coolant at a velocity of at least 6 m/s and no more than 8 m/s.

18. The apparatus of claim 12, and further comprising a pump:
wherein the enclosure includes a pump plenum configured to laterally receive the coolant received into the enclosure;
wherein the pump is configured to receive coolant from the pump plenum; and
wherein the jets are configured to receive coolant from the pump.

19. The apparatus of claim 12, wherein the jets are point jets targeted at components.

20. The apparatus of claim 12, wherein the one or more assemblies that the first tier is configured to support further comprise a second plurality of planar cards stacked along the first lateral dimension across the first tier, and further comprising a substantially non-vented mid-plane between the first and second plurality of planar cards, wherein the mid-plane is normal to the second lateral dimension.

21. An method of cooling a plurality of assemblies in an enclosure configured to form a plurality of tiers stacked along a longitudinal dimension, each tier being configured to support one or more assemblies of the plurality of assemblies, the plurality of tiers including a first tier, wherein each tier of the plurality of tiers has opposite first and second longitudinal ends with respect to the longitudinal dimension, and wherein the one or more assemblies that the first tier is configured to support comprise a plurality of planar cards stacked along a first lateral dimension, with respect to the longitudinal dimension, across the first tier, comprising:
laterally receiving coolant, along a second lateral dimension with respect to the longitudinal dimension, into a distribution plenum defined by the enclosure, the distribution plenum being longitudinally contiguous to the first longitudinal end of the first tier;
longitudinally distributing the coolant from the distribution plenum into the first longitudinal end of the first tier;
longitudinally receiving the coolant from the second longitudinal end of the first tier into an exhaust plenum defined by the enclosure, the exhaust plenum being longitudinally contiguous to the second longitudinal end of the first tier;
laterally exhausting the coolant from the exhaust plenum in the direction along the second lateral dimension.

22. The method of claim 21, wherein in the step of longitudinally distributing, the coolant is pumped through jets configured to direct streams of coolant toward the plurality of assemblies.

23. An apparatus for cooling a plurality of assemblies, comprising:
an enclosure configured to form a plurality of tiers stacked in a longitudinal dimension, the plurality of tiers including a first tier; and
a pump;
wherein each tier of the plurality of tiers has opposite first and second longitudinal ends with respect to the longitudinal dimension;
wherein each tier is configured to support one or more assemblies of the plurality of assemblies;
wherein the enclosure defines a distribution plenum longitudinally contiguous to the first longitudinal end of the first tier, the distribution plenum being configured to distribute received coolant through the first longitudinal end of the first tier;
wherein the distribution plenum includes a wall defining a boundary between the distribution plenum and the first longitudinal end of the first tier, the wall including a plurality of orifices configured to direct coolant received by the distribution plenum through the first tier at selected locations;
wherein the plurality of orifices are configured as jets;
wherein the enclosure includes a pump plenum configured to laterally receive the coolant received into the enclosure;
wherein the pump is configured to receive coolant from the pump plenum; and wherein the jets are configured to receive coolant from the pump.

24. The apparatus of claim 23, wherein the one or more assemblies that the first tier is configured to support further comprise a second plurality of planar cards stacked along the first lateral dimension across the first tier, and further comprising a substantially non-vented mid-plane between the first and second plurality of planar cards, wherein the mid-plane is normal to the second lateral dimension.

25. An apparatus for cooling a plurality of planar cards, comprising:
an enclosure configured to form a plurality of tiers stacked along a longitudinal dimension, including a first tier;
wherein each tier of the plurality of tiers has opposite first and second longitudinal ends with respect to the longitudinal dimension;
wherein the first tier is configured to support a first group of planar cards, from among the plurality of planar cards, the first group of planar cards being stacked along a lateral dimension, with respect to the longitudinal dimension, across the tier;
wherein the first tier is further configured to support a second group of planar cards, from among the plurality of planar cards, the second group of planar cards being stacked along the lateral dimension across the first tier;
wherein the first tier further comprises a substantially non-vented mid-plane extending along the lateral dimension between the first and second groups of planar cards; and
wherein the enclosure defines a first plenum longitudinally contiguous to the first longitudinal end of each tier, each first plenum being configured to at least one of distribute or exhaust coolant through the first longitudinal end of the first tier.

26. The apparatus of claim 25, wherein:
each first plenum is a distribution plenum configured to distribute received coolant through the first longitudinal end of its respective tier;
the enclosure further defines an exhaust plenum longitudinally contiguous to the second longitudinal end of each tier, each exhaust plenum being configured to channel away coolant received from the second longitudinal end of its respective tier; and
the enclosure is configured such that coolant supplied to the distribution plenum is received laterally into the enclosure, and such that coolant received by the exhaust plenum is channeled laterally out of the enclosure.

27. The apparatus of claim 26, wherein:
the enclosure is configured such that coolant supplied to the distribution plenum is received into the enclosure in a direction along a second lateral dimension with respect to the longitudinal dimension, and such that coolant received by the exhaust plenum is channeled out of the enclosure in the direction. along the second lateral dimension.

28. The apparatus of claim 25, and further comprising a pump:
wherein the enclosure includes a pump plenum configured to laterally receive the coolant received into the enclosure;
wherein the pump is configured to receive coolant from the pump plenum; and
wherein jets are configured to receive coolant from the pump and direct coolant longitudinally toward the cards.

* * * * *

UNITED STATES PATENT AND TRADEMARK OFFICE
CERTIFICATE OF CORRECTION

PATENT NO. : 7,184,267 B2
APPLICATION NO. : 10/735467
DATED : February 27, 2007
INVENTOR(S) : Chandrakant D Patel It is certified that error appears in the above-identified patent and that said Letters Patent is hereby corrected as shown below:

On the title page, item (73), in "Assignee", in column 1, line 2, delete "LP." and insert -- L.P. --, therefor.

On page 2, item (56), under "Foreign Patent Documents", in column 2, line 1, delete "DE   4035213 *  11/1992".

In column 12, line 10, in Claim 21, delete "An" before "method" and insert -- A --, therefor.

In column 14, line 21, in Claim 27, after "direction" delete ".".

Signed and Sealed this

Thirtieth Day of June, 2009

JOHN DOLL
*Acting Director of the United States Patent and Trademark Office*